(12) United States Patent
Wang et al.

(10) Patent No.: US 6,358,844 B1
(45) Date of Patent: Mar. 19, 2002

(54) TUNGSTEN DEPOSITION PROCESS WITH DUAL-STEP NUCLEATION

(75) Inventors: Mei-Yun Wang, Hsin-Chu; Shau-Lin Shue, Hsinchu, both of (TW)

(73) Assignee: Taiwan Semiconductor Manufacturing, Company, Ltd, Hsin Chu (TW)

( * ) Notice: Subject to any disclaimer, the term of this patent is extended or adjusted under 35 U.S.C. 154(b) by 0 days.

(21) Appl. No.: 09/585,183

(22) Filed: Jun. 1, 2000

(51) Int. Cl.[7] ............................................. H01L 21/44
(52) U.S. Cl. ..................... 438/654; 438/655; 438/656; 438/675; 438/683
(58) Field of Search .............................. 438/654, 655, 438/656, 675, 683

(56) References Cited

U.S. PATENT DOCUMENTS 5,489,552 A * 2/1996 Merchant et al.
6,245,654 B1 * 6/2001 Shih et al. .................. 438/597

FOREIGN PATENT DOCUMENTS

| | | | |
|---|---|---|---|
| EP | 587401 A2 | * | 3/1994 |
| EP | 591086 A2 | * | 4/1994 |
| EP | 785574 A2 | * | 7/1997 |

* cited by examiner

Primary Examiner—Trung Dang
(74) Attorney, Agent, or Firm—Tung and Associates

(57) ABSTRACT

A tungsten plug deposition process that incorporates a dual-step nucleation method and the semiconductor structure formed by such method are disclosed. In the tungsten plug deposition process, a first nucleation layer is formed in the via openings in the semiconductor substrate by flowing a reactant gas mixture of $WF_6/SiH_4$ at a first mix ratio between 1:1 and 1:10 in a chemical vapor deposition chamber. A second nucleation layer is then formed on top of the first nucleation layer by flowing a reactant gas mixture of $WF_6/SiH_4$ at a second mix ratio between 2:1 and 5:1 into the chemical vapor deposition chamber. A total thickness of less than 500 Å for the first and second nucleation layers is normally sufficient. The first nucleation layer formed is a silicon rich layer, or a $WSi_x$ layer, while the second nucleation layer is substantially W. The present invention novel method produces tungsten plugs that have significantly improved step coverage and cumulative resistance properties, while not sacrificing any electro-migration resistance.

15 Claims, 1 Drawing Sheet

TUNGSTEN DEPOSITION PROCESS WITH DUAL-STEP NUCLEATION

FIELD OF THE INVENTION

The present invention generally relates to a tungsten deposition process that incorporates a nucleation step and more particularly, relates to a tungsten deposition process for filling via openings in a semiconductor substrate incorporating a dual-step nucleation process for depositing first a $WSi_x$ layer and then a W layer on top.

BACKGROUND OF THE INVENTION

In the fabrication of semiconductor devices, metal contacts and vias are frequently formed in contact holes and via openings on silicon wafers that have been pre-processed with insulating layers on top. Devices are then fabricated by connecting the components with metal contacts and vias to form the integrated circuit. In particular, aluminum, aluminum alloys, tungsten and tungsten alloys are used for depositing into contact holes and via openings on silicon substrates. The deposition process can be carried out either in a physical vapor deposition (PVD) chamber or in a chemical vapor deposition (CVD) chamber.

As the dimensions of semiconductor devices continuously to shrink in the miniaturization of modern semiconductor devices to the sub-half-micron range, via openings and contact holes must also shrink. Consequently, the openings and holes to be filled have larger aspect ratios, i.e., the ratios between the depth of the opening or hole and the diameter.

Difficulties have been encountering in depositing conductive metals into via openings and contact holes that have high aspect ratios by the conventional sputtering process. As the openings or holes become smaller and deeper, the bottom and sides of an opening or hole receive fewer deposited metal particles than the top surface of the device. The end result of such a phenomenon, sometimes called a shadowing effect, is that metal layers formed by the particles hang over the opening forming an overhang. The overhand closes before the opening is completely filled as the deposition process progresses and thus creating a void in the opening or hole.

One technique used to remedy the shadowing effect of the sputtering process is to use a tungsten chemical vapor deposition (W CVD) technique for filling openings and holes that have large aspect ratios. The W CVD process solves the difficult problems in metalization to ensure enough metal continuity in contact windows and vias. The step coverage of deep openings or holes by the W CVD particles is greatly improved over that possible by any other deposition techniques. In a W CVD process conducted on a silicon substrate for filling a contact hole, the basic chemistry may be a reaction such as

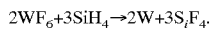
$$2WF_6 + 3SiH_4 \rightarrow 2W + 3Si_xF_4.$$

During a W CVD deposition process, a wafer is usually held on a vacuum chuck that is heated to a temperature between about 400° C. and about 500° C. A shower head is positioned opposite to the wafer where $WF_6/SiH_4$ gases are injected. Normally, a two-or three-step process is involved where $SiH_4$ is first introduced without any flow of $WF_6$ to initiate a deposition of a very thin seed layer of amorphous silicon as a prenucleation layer. The prenucleation process is then followed by a $SiH_4+WF_6$ silane reduction nucleation process for depositing a thin W nucleation layer, and then the faster rate $H_2+WF_6$ hydrogen reduction process for bulk W deposition. During the nucleation stage, less than 100 nm of tungsten is deposited, while the bulk of the tungsten deposition is by the hydrogen reduction process. The multi-stage deposition process is designed such that during the initial nucleation stage, the silicon from the source/drain area is not consumed in the reaction since $WF_6$ would react readily with Si. When $WF_6$ reacts with Si from the source/drain region, a defect known as junction leakage may occur. The introduction of $SiH_4$ first into the reaction avoids the consumption of Si from the substrate. The initial introduction of $SiH_4$ into the reaction without $WF_6$ for the deposition of the prenucleation layer of Si is known as a silane soak step.

In the W CVD process, a W CVD is frequently blanket-deposited onto a wafer surface and into the contact holes after a metal nucleation layer is first deposited on the entire wafer. The W deposited on the glue/barrier layer, i.e., a Ti/TiN layer, is then etched off in an etchback process by a process of reactive ion etching or by CMP process. After the etchback process, only the thicker W in the contact holes are left. Since the process relies on the removal of all W CVD except in the contact holes, the uniformity of the W deposition and the RIE etchback process is critical for the successful formation of W contact plugs. When the process is not accurately controlled, such as with the pre-disposition of a nucleation layer of Ti/TiN, the W contact plugs may be substantially recessed after the etchback process and thus results in poor step coverage on the device.

In the conventional single-step nucleation process conducted after a diffusion barrier layer deposition, the ratio of $WF_6/SiH_4$ in the reactant gas mixture must be kept low in order to avoid chemical attack of $WF_6$ or defect formation known as volcano effect. At a low flow rate of $WF_6$, the step coverage of the subsequent tungsten deposition for forming the plug is poor. The step coverage problem becomes more severe with decreasing feature size at the contact or via level which renders a perfect plug forming impossible. The step coverage in filling a contact of via is extremely important in a tungsten CVD process in order to achieve desirable resistance values and device reliability. The conventional single step nucleation process is therefore inadequate for achieving high reliability plug filling and for improving step coverage.

It is therefore an object of the present invention to provide a tungsten plug deposition process that does not have the drawbacks or shortcomings of the conventional tungsten deposition process incorporating single-step nucleation.

It is another object of the present invention to provide a tungsten plug deposition process incorporating a dual-step nucleation method.

It is a further object of the present invention to provide a tungsten plug deposition process incorporating a dual-step nucleation method such that two separate nucleation layers are deposited into via openings before the bulk tungsten deposition.

It is another further object of the present invention to provide a tungsten plug deposition process incorporating a dual-step nucleation method by using a reactant gas mixture of $WF_6/SiH_4$ at different mix ratios for the two nucleation layers.

It is still another object of the present invention to provide a tungsten plug deposition process incorporating a dual-step nucleation method in which a first nucleation step is carried out by flowing a reactant gas mixture that is silicon rich followed by a second nucleation step by flowing a reactant gas mixture that is tungsten rich.

It is yet another object of the present invention to provide a tungsten plug deposition process incorporation a dual-step nucleation method by forming two separate nucleation layers consisting of a first layer of $WSi_x$ and a second layer of W.

It is still another further object of the present invention to provide a semiconductor structure that has tungsten plugs formed in a top surface including, in each plug, a first nucleation layer contacting the via openings of substantially $WSi_x$ and a second nucleation layer on top of the first nucleation layer of substantially W.

It is yet another further object of the present invention to provide a method for tungsten plug deposition incorporating a dual-step nucleation process in which a first nucleation layer is deposited by a reactant gas mixture of $WF_6/SiH_4$ having a mix ratio smaller than 1:1 followed by the deposition of a second nucleation layer by flowing a reactant gas mixture of $WF_6/SiH_4$ having a mix ratio larger than 2:1.

SUMMARY OF THE INVENTION

In accordance with the present invention, a tungsten plug deposition process incorporating a dual-step nucleation method and the semiconductor structure formed with tungsten plugs are disclosed.

In a preferred embodiment, a tungsten plug deposition process incorporating a dual-step nucleation method can be carried out by the operating steps of positioning a substrate that has via holes for forming tungsten plugs therein in a chemical vapor deposition (CVD) chamber, depositing into the via holes a first nucleation layer by flowing a reactant gas mixture of $WF_6/SiH_4$ at a first mix ratio between 1:1 and 1:10 into the CVD chamber, depositing into the via holes a second nucleation layer on top of the first nucleation layer by flowing a reactant gas mixture of $WF_6/SiH_4$ at a second mix ratio between 2:1 and 5:1 into the CVD chamber, and filling the via holes with tungsten forming the tungsten plugs.

The method for forming tungsten plugs incorporating a dual-step nucleation method may further include the step of depositing the first and the second nucleation layer to a total thickness of less than 500 Å. The method may further include the step of depositing the first nucleation layer by flowing a reactant gas mixture of $WF_6/SiH_4$ at a first mix ratio between 1:1 and 1:5. The method may further include the step for depositing a second nucleation layer by flowing a reactant gas mixture of $WF_6/SiH_4$ at a second mix ratio between 2:1 and 5:1. The method may further include the step of depositing the first and the second nucleation layers at a temperature between about 380° C. and about 450° C., or preferably between about 410° C. and about 430° C. The method may further include the step of flowing the reactant gas mixture of $WF_6/SiH_4$ into the CVD chamber to a chamber pressure between about 4.5 Torr and about 30 Torr. The method may further include the step of flowing the reactant gas mixture of $WF_6/SiH_4$ at a first mix ratio into the CVD chamber for a time period between about 3 sec and about 10 sec, or the step of flowing the reactant gas mixture of $WF_6/SiH_4$ at a second mix ratio into the CVD chamber for a time period between about 10 sec and about 25 sec. The first nucleation layer deposited may be substantially $WSi_x$, the second nucleation layer deposited may be substantially W.

The present invention is further directed to a method for forming tungsten plugs incorporating a dual-step nucleation process which can be carried out by the operating steps of positioning a substrate in a chemical wafer deposition chamber, the substrate has via openings formed in a top surface, depositing into the via openings a first nucleation layer of $WSi_x$, depositing into the via openings a second nucleation layer of W on top of the first nucleation layer and filling the via openings with W forming the W plugs.

The method for forming tungsten plugs incorporating a dual-step nucleation method may further include the step of depositing the first and the second nucleation layer to a total thickness between about 200 Å and about 500 Å. The method may further include the step of depositing the first and the second nucleation layer by a reactant gas mixture of $WF_6/SiH_4$. The method may further include the step of depositing the first nucleation layer by a reactant gas mixture that contains more $SiH_4$ than $WF_6$, or the step of depositing the second nucleation layer by a reactant gas mixture that contains more $WF_6$ than $SiH_4$. The method may further include the step of depositing the first nucleation layer for a shorter length of time than the time required for depositing the second nucleation layer.

The present invention is further directed to a semiconductor structure that has tungsten plugs formed in a top surface including a semiconductor substrate that has a top active surface, a plurality of via openings in the top active surface, and a plurality of tungsten plugs formed in the plurality of via openings each further includes a first nucleation layer contacting surfaces in the plurality of via openings formed of substantially $WSi_x$, a second nucleation layer on top of the first nucleation layer formed of substantially W, and a tungsten filling the plurality of via openings.

In the semiconductor structure that has tungsten plugs formed in a top surface, the first nucleation layer and the second nucleation layer may have a total thickness between about 200 Å and about 500 Å. The semiconductor structure may further include a diffusion barrier layer deposited between the first nucleation layer and the inner wall of the plurality of via openings. The semiconductor structure may be a silicon wafer.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a tungsten plug deposition method which utilizes a dual-step nucleation process instead of the conventional single-step nucleation process. By utilizing the present invention novel method, a first nucleation step is conducted with a reactant gas mixture of $WF_6/SiH_4$ that is silicon rich for depositing a silicon rich layer or a $WSi_x$ layer, a second nucleation layer is then deposited on top of the first nucleation layer by flowing a reactant gas mixture of $WF_6/SiH_4$ which is tungsten rich for forming a substantially W layer.

Figure 1:
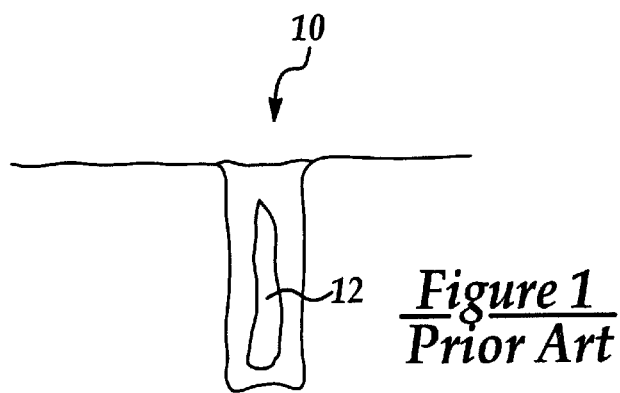
FIG. 1 is an enlarged, cross-sectional view of a tungsten plug filled by a conventional method utilizing a single-step nucleation process.
Figure 2:
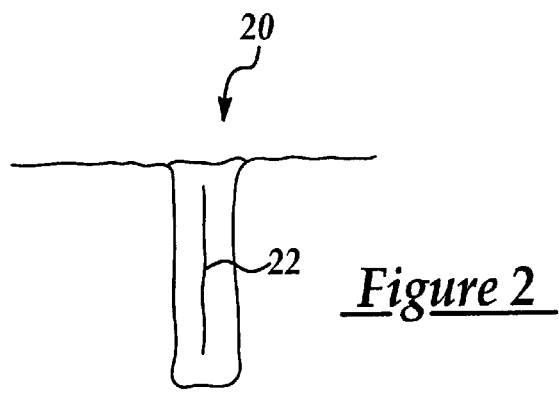
FIG. 2 is an enlarged, cross-sectional view of a tungsten plug formed by the present invention method incorporating a dual-step nucleation process.

In the first nucleation layer formation process of the present invention, a reactant gas mixture of $WF_6/SiH_4$ at a first mix ratio between 1:1 and 1:10 may be used. In the deposition process for the second nucleation layer, a reactant gas mixture of $WF_6/SiH_4$ at a second mix ratio between 2:1 and 5:1 may be used. In the first nucleation process, a significantly lower $WF_6$ flow rate is used (when compared to the flow rate of $SiH_4$) in order to form a very thin silicon rich layer, i.e., a $WSi_x$ layer, as a protection layer. In the second nucleation process, a significantly higher $WF_6$ flow rate is used (when compared to the flow rate of $SiH_4$) to form a nucleation layer of W that has greatly improved step coverage to eliminate void formation. This is shown in FIGS. 1 and 2 for comparison. In FIG. 1, a conventional tungsten plug 10 is formed by a single-step nucleation method resulting in a large void 12 formed in the plug. In FIG. 2, a tungsten plug 20 formed by the present invention novel method incorporating a dual-step nucleation process is shown. Only a seam line 22, and not any void, is formed in the plug 20.

By utilizing the present invention novel method, the gas filling and the cumulative resistance performance are both improved without any impact on the plug electromigration performance.

In the present invention method of dual-step nucleation, the first nucleation layer is formed by flowing a reactant gas mixture of $WF_6/SiH_4$ at a first mix ratio between 1:1 and 1:10, and preferably between 1:1 and 1:5 into a chemical vapor deposition chamber. A second nucleation layer is formed by flowing a reactant gas mixture of $WF_6/SiH_4$ at a second mix ratio between 2:1 and 5:1, and preferably between 3:1 and 5:1 into a chemical vapor deposition chamber. In the first nucleation process, a silicon rich layer, or a $WSi_x$ layer is formed. In the second nucleation process, a substantially W layer is formed. The total thickness for the two nucleation layers may be less than 500 Å, or in the range between 200 Å and 500 Å. The deposition of the first nucleation layer and the second nucleation layer can be carried out at a temperature between about 380° C. and about 440° C., and preferably between about 410° C. and about 430° C. The reactant gas mixture of $WF_6/SiH_4$ is flown into the chemical deposition chamber to a chamber pressure between about 4.5 Torr and about 30 Torr. The word "about" used in this writing means a range of values ±10% from the average value given.

The reactant gas mixture of $WF_6/SiH_4$ is flown into the chemical vapor deposition chamber for a time period between about 3 sec and about 10 sec for forming the first nucleation layer, and between about 10 sec and about 25 sec for forming the second nucleation layer. When compared to a conventional single-step nucleation process in which flow rates of 20/10 sccm for $WF_6/SiH_4$ are used, at a deposition temperature of 425° C. and a deposition pressure of 4.5 Torr, and for a time period of 30 sec, the following are typical deposition conditions for the present invention dual-step nucleation layer deposition.

For the first nucleation layer, reactant gas flow rates of 6/30 sccm for $WF_6/SiH_4$ are used, a deposition temperature of 425° C. and a deposition pressure between 4.5 Torr~30 Torr are used for a time period of 5 arc.

In the second nucleation layer deposition process, reactant gas flow rates of 30/10 sccm for $WF_6/SiH_4$ at a deposition temperature of 425° C. and a deposition pressure between 4.5 Torr~30 Torr are utilized for a time period of 25 sec or less.

In another preferred embodiment of the present invention, a method for forming tungsten plugs incorporating a dual-step nucleation process can be carried out by first positioning a substrate in a chemical vapor deposition chamber, the substrate has via openings formed in a top surface, then depositing into the via openings a first nucleation layer of substantially $WSi_x$, then depositing into the via openings a second nucleation layer W on top of the first nucleation layer, and then filling the via openings with tungsten forming the tungsten plugs. In the method, the deposition process for the first nucleation layer can be carried out by a reactant gas mixture that contains more $SiH_4$ than $WF_6$, the second nucleation layer may be deposited by a reactant gas mixture that contains more $WF_6$ than $SiH_4$.

The present invention is further directed to a semiconductor structure that has tungsten plugs formed in a top surface which includes a semiconductor substrate that has a top active surface, a plurality of via openings in the top active surface, and a plurality of tungsten plugs formed in the plurality of via openings each further includes a first nucleation layer contacting a surface in the plurality of via openings formed of substantially $WSi_x$, a second nucleation layer on top of the first nucleation layer formed of substantially W and a tungsten filling the plurality of via openings. The first nucleation layer and the second nucleation layer in the plurality of via openings may have a total thickness between about 200 Å and about 500 Å. The semiconductor structure may further include a diffusion barrier layer that is deposited between the first nucleation layer and an inner wall of the plurality of via openings. Such diffusion barrier layer may be advantageously formed of Ti or TiN.

Figure 3:
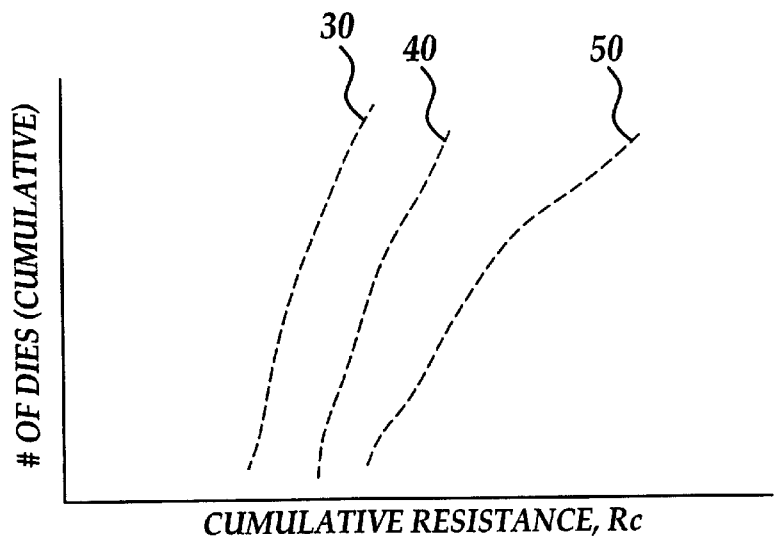
FIG. 3 is a graph illustrating the dependency of the number of IC dies on the cumulative electrical resistance.

The desirable properties of the tungsten plugs formed by the present invention novel method are shown in FIG. 3, in a graph plotted of the total number of dies (cumulative) against the cumulative electrical resistance. Curves 30 and 40 are obtained on semiconductor wafers processed by the present invention novel method incorporating the dual-step nucleation process. Curve 50 illustrates data obtained on a silicon wafer that is processed by the conventional tungsten plug deposition process using a single-step nucleation method. It is seen that the cumulative resistance of the tungsten plugs formed by present invention method is significantly lower than that obtained by the conventional single-step nucleation method.

The present invention novel method for tungsten plug deposition incorporating a dual-step nucleation process and the semiconductor structure formed by the method have therefore been amply described in the above description and in the appended drawings of FIGS. 2 and 3.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

What is claimed is:

1. A tungsten plug deposition process with dual-step nucleation comprising the steps of:
   positioning a substrate having via holes for forming tungsten plugs therein in a chemical vapor deposition (CVD) chamber,
   depositing into said via holes a first nucleation layer by flowing a reactant gas mixture of $WF_6/SiH_4$ at a first mix ratio between 1:1 and 1:10 into said CVD chamber,
   depositing into said via holes a second nucleation layer on top of said first nucleation layer by flowing a reactant gas mixture of $WF_6/SiH_4$ at a second mix ratio between 2:1 and 5:1, and
   filling said via holes with tungsten forming said tungsten plugs.

2. A tungsten deposition process with dual-step nucleation according to claim 1 further comprising the step of depositing said first and said second nucleation layer to a total thickness of less than 500 Å.

3. A tungsten deposition process with dual-step nucleation according to claim 1 further comprising the step of depositing said first nucleation layer by flowing a reactant gas mixture of $WF_6/SiH_4$ at a first mix ratio between 1:1 and 1:5.

4. A tungsten deposition process with dual-step nucleation according to claim 1 further comprising the step of depositing said second nucleation layer by flowing a reactant gas mixture of $WF_6/SiH_4$ at a second mix ratio between 3:1 and 5:1.

5. A tungsten deposition process with dual-step nucleation according to claim 1 further comprising the step of depositing said first and said second nucleation layers at a temperature between about 380° C. and about 450° C.

6. A tungsten deposition process with dual-step nucleation according to claim 1 further comprising the step of depositing said first and said second nucleation layers at a temperature between about 410° C. and about 430° C.

7. A tungsten deposition process with dual-step nucleation according to claim 1 further comprising the step of flowing said reactant gas mixture of $WF_6/SiH_4$ into said CVD chamber to a chamber pressure between about 4.5 Torr and about 30 Torr.

8. A tungsten deposition process with dual-step nucleation according to claim 1 further comprising the step of flowing said reactant gas mixture of $WF_6/SiH_4$ at a first mix ratio into said CVC chamber for a time period between about 3 sec And about 10 sec.

9. A tungsten deposition process with dual-step nucleation according to claim 1 further comprising the step of flowing said reactant gas mixture of $WF_6/SiH_4$ at a second mix ratio into said CVD chamber for a time period between about 10 sec and about 25 sec.

10. A tungsten deposition process with dual-step nucleation according to claim 1 wherein said first nucleation layer deposited is substantially $WSi_x$, said second nucleation layer deposited is substantially W.

11. A method for forming tungsten plugs incorporating a dual-step nucleation process comprising the steps of:

positioning a substrate in a chemical vapor deposition (CVD) chamber, said substrate having via openings formed in a top surface, depositing into said via opening a first nucleation layer of $WSi_x$ by a reactant gas mixture of $WF_6/SiH_4$, depositing into said via openings a second nucleation layer of W on top of said first nucleation layer by a reactant gas mixture of $WF_6/SiH_4$, and filling said via openings with W forming said W plugs.

12. A method for forming tungsten plugs incorporating a dual-step nucleation process according to claim 11 further comprising the step of depositing said first and said second nucleation layers to a total thickness of between about 200 Å and about 500 Å.

13. A method for forming tungsten plugs incorporating a dual-step nucleation process according to claim 11 further comprising the step of depositing said first nucleation layer by a reactant gas mixture that contains less $WF_6$ than $SiH_4$.

14. A method for forming tungsten plugs incorporating a dual-step nucleation process according to claim 11 further comprising the step of depositing said second nucleation layer by a reactant gas mixture that contains more $WF_6$ than $SiH_4$.

15. A method for forming tungsten plugs incorporating a dual-step nucleation process according to claim 11 further comprising the step of depositing said first nucleation layer for a shorter length of time than the time required for depositing said second nucleation layer.

* * * * *